(12) United States Patent
Alexander

(10) Patent No.: US 6,208,191 B1
(45) Date of Patent: Mar. 27, 2001

(54) POSITIVE AND NEGATIVE VOLTAGE CLAMP FOR A WIRELESS COMMUNICATION INPUT CIRCUIT

(75) Inventor: Sam E. Alexander, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/182,090

(22) Filed: Oct. 29, 1998

(51) Int. Cl.[7] .................................................. H03K 5/08
(52) U.S. Cl. ............................ 327/309; 327/314; 327/320
(58) Field of Search ..................................... 327/306, 309, 327/310, 311, 314, 315, 318, 319, 320, 180, 427, 434

(56) References Cited

U.S. PATENT DOCUMENTS

| | | | |
|---|---|---|---|
| 4,423,431 | * | 12/1983 | Sasaki ...................................... 357/41 |
| 4,533,846 | * | 8/1985 | Simko ...................................... 327/321 |
| 5,206,544 | * | 4/1993 | Chen et al. ............................... 326/30 |
| 5,301,081 | * | 4/1994 | Podell et al. ............................. 361/56 |
| 5,528,190 | * | 6/1996 | Honnigford ............................. 327/328 |
| 5,534,811 | * | 7/1996 | Gist et al. ............................... 327/309 |
| 5,574,395 | * | 11/1996 | Kusakabe ............................... 327/309 |

FOREIGN PATENT DOCUMENTS 0 032 018   7/1981   (EP) .

OTHER PUBLICATIONS

Jan. 25, 00 International Search Report.

* cited by examiner

Primary Examiner—Timothy P. Callahan
Assistant Examiner—Hai L. Nguyen
(74) Attorney, Agent, or Firm—Baker Botts L.L.P.

(57) ABSTRACT

An improved voltage clamp for operating with wireless communication input circuits over the RF band. The clamp provides for symmetrical clamping for excessive positive and negative input voltage excursions. The clamp does not exact a current penalty when operating in the non-excessive positive and negative input voltage regimes. The clamp is comprised of an input node, a capacitor, a MOS transistor, a diode and a ground potential node.

24 Claims, 3 Drawing Sheets

US 6,208,191 B1

POSITIVE AND NEGATIVE VOLTAGE CLAMP FOR A WIRELESS COMMUNICATION INPUT CIRCUIT

BACKGROUND OF THE INVENTION

1. Field of the Invention

This invention relates generally to wireless communication input circuits in semiconductor devices. Specifically the present invention relates to clamping the input voltage which may be induced in the presence of strong RF fields for the purpose of preventing damage to electronics connected to the input circuit.

2. Description of the Prior Art

A wireless communication input circuit has two desirable characteristics. First, a high impedance input is needed so that power is not dissipated in the input circuit. Second, a low impedance over-voltage clamp is required so that electronic circuitry downstream of the input circuit is protected from high voltages which are induced in the presence of strong RF fields.

The current state of the art describes voltage clamps which are implemented by means of zener diodes. While there are numerous limitations to zener diodes, a primary concern are controlling fabrication parameters in RF input circuits which are implemented on a single, monolithic integrated circuit. Zener diodes also are characterized by difficulty in creating symmetrical clamping for positive and negative voltages.

Therefore, a need existed to provide a voltage clamp that will provide symmetrical positive and negative voltage clamping.

SUMMARY OF THE INVENTION

It is an object of the present invention to provide a voltage clamp for wireless input circuits which operate over the radio frequency domain.

It is another object of the present invention to provide a voltage clamp that clamps both positive and negative voltages.

It is another object of the present invention to provide a voltage clamp that clamps input voltage symmetrically in the positive and negative directions.

It is another object of the present invention to provide a symmetrical voltage clamp for both positive and negative voltages that is implemented on a single, monolithic integrated circuit.

In accordance with one embodiment of the present invention, a positive and negative voltage clamp for an input circuit is comprised of an input node, a node connected to ground potential, a MOS transistor, a diode and a capacitor which is coupled to the input node and to the control electrode of the transistor.

In accordance with another embodiment of the present invention, the MOS transistor is a P-channel transistor.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
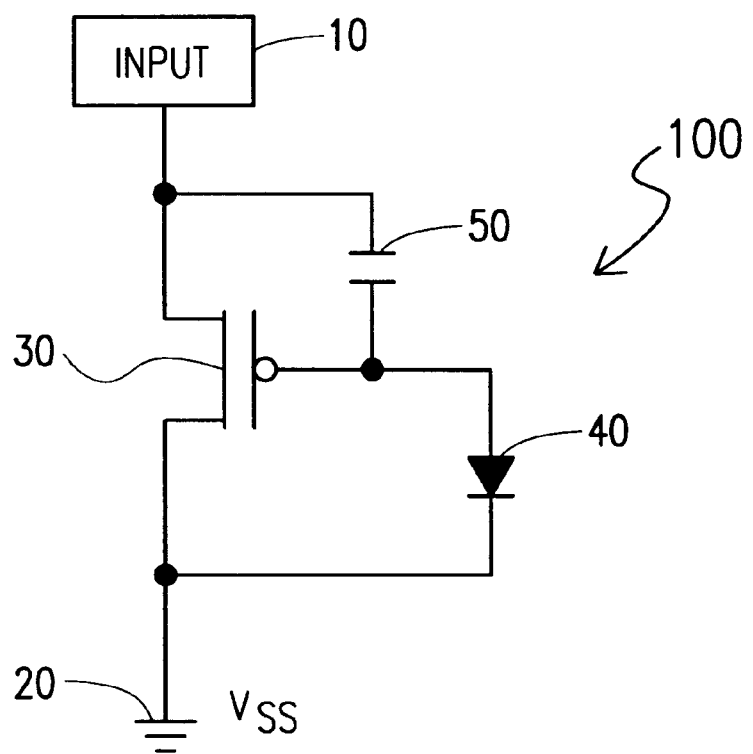
FIG. 1 is an electrical diagram of the present invention.

Referring to FIGS. 1, a positive and negative voltage clamp for an input circuit 100 (hereinafter clamp) is shown. The clamp 100 is comprised of an input node 10, a node connected to ground potential 20 (hereinafter $V_{SS}$), a MOS transistor 30, a diode 40 and a capacitor 50 which is coupled to the input node 10 and to the control electrode (hereinafter gate) of the transistor 30. The capacitor 50 is within the range of 0.1 picofarads to 10 picofarads.

In the preferred embodiment, the MOS transistor 30 is a P-channel transistor. In an alternative embodiment, the MOS transistor 30 is a N-channel transistor and the anode/cathode orientation of the diode 40 is reversed from the circuit of FIG. 1.

The purpose of the P-channel transistor 30 is to limit the positive and negative voltage excursion in relatively strong RF fields by acting as a bypass switch which conducts current and limits voltage. The capacitor 50 is used to couple the voltage at the input node 10 to the gate of the P-channel transistor 30. The purpose of the diode 40 is to expedite clamping by the P-channel device with in positive voltage excursion. In the preferred embodiment, all of the above components of the clamp are fabricated on a single, monolithic integrated circuit.

In the ideal case, the capacitance 50 is approximately equal to the parasitic capacitance of the P-Channel transistor 30. The parasitic capacitance of the P-channel device 30 comprises a number of different capacitances inherent to MOS devices. However, for the purposes of the present invention, these several inherent capacitances can be consolidated to a parasitic capacitance between the control electrode and $V_{SS}$. Thus, the circuit may be viewed, in part, as a simple capacitor divider. If this were the case, then the gate voltage $V_G$ would be one-half of the input voltage $V_{IN}$ and symmetrical clamping is achieved because the threshold voltage of $V_{GS}$ would occur at the same $V_{IN}$ (in terms of absolute value) operating in the negative and positive regimes.

However, in practice, the parasitic capacitance is highly dynamic over positive and negative input voltage swings. The result is that the parasitic capacitance is unpredictable and thereby leads to a non-linear gate voltage as the input voltage varies between positive and negative. Thus, in the preferred embodiment, the capacitor 50 is made significantly larger than the parasitic capacitance of the P-channel device 30 such that the capacitor 50 dominates the capacitor divider equation. The result of this implementation is that $V_G$ more closely tracks $V_{IN}$.

The operation of the clamp may be explained by analyzing three cases: excessive positive voltage excursion, excessive negative voltage excursion and non-excessive positive or negative voltage excursion.

Figure 2:
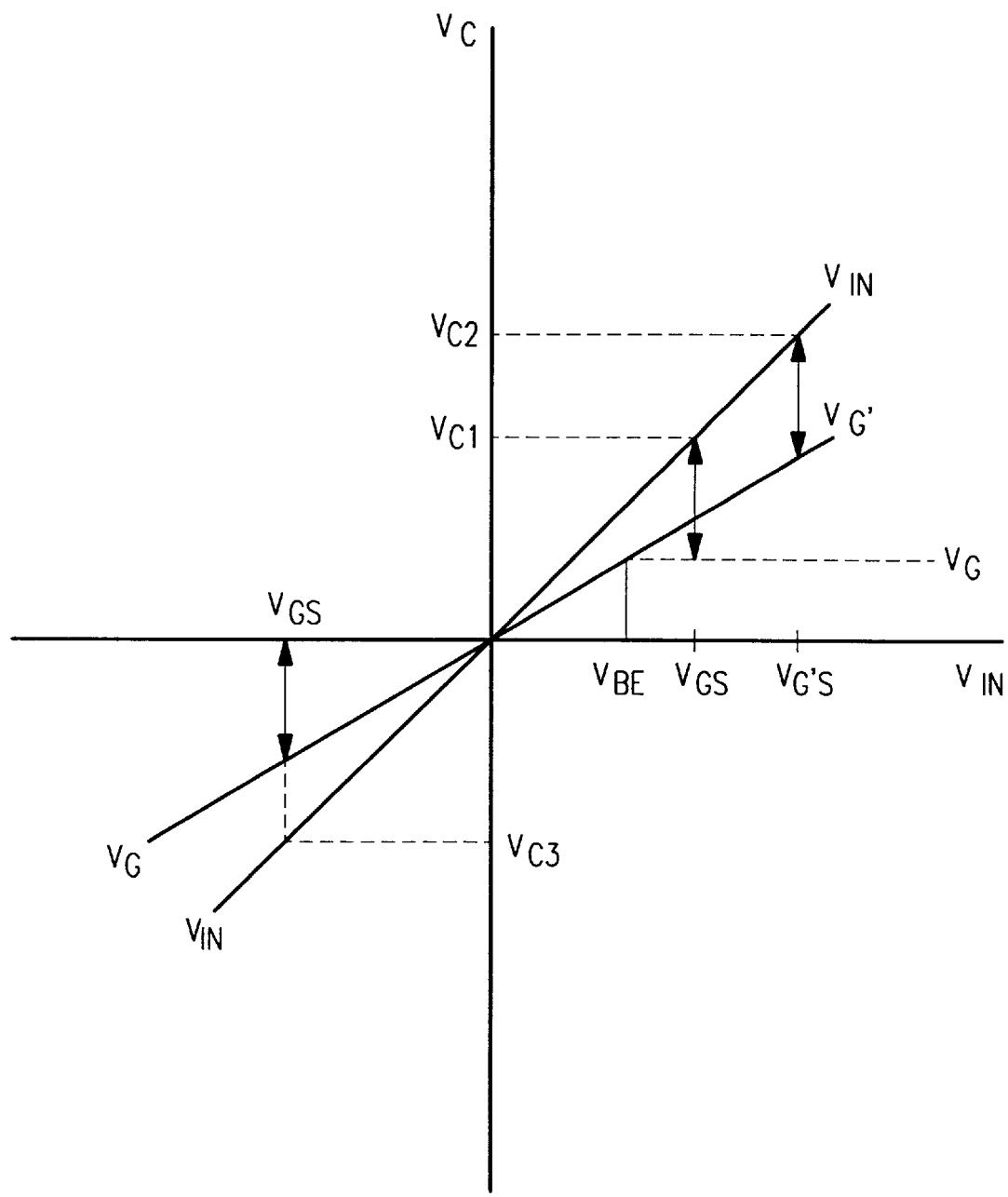
FIG. 2 is the transfer characteristics of the input voltage versus the gate voltage with and without a diode and for positive and negative potentials.

For the case of the excessive positive voltage excursion, as the voltage $V_{IN}$ at the input node 10 increases the gate voltage $V_G$ of the P-channel device 30 couples up to the input node 10 through the capacitor 50. Referring to FIG. 2, $V_G$ is shown slightly lagging $V_{IN}$ due to the dominance of the capacitor 50 as compared to the parasitic capacitance. Thus, in the absence of the diode, the differential in gate-source potential is slow to develop.

The diode 50 will limit the positive potential at the gate to $V_{BE}$. As $V_{IN}$ continues to climb, a $V_{GS}$, which is equal to the difference of $V_{IN}$ and $V_{BE}$, is applied to the P-channel device 30. When $V_{GS}$ is equal to the threshold voltage of the P-channel transistor 30, the P-channel transistor 30 will turn on.

Figure 3:
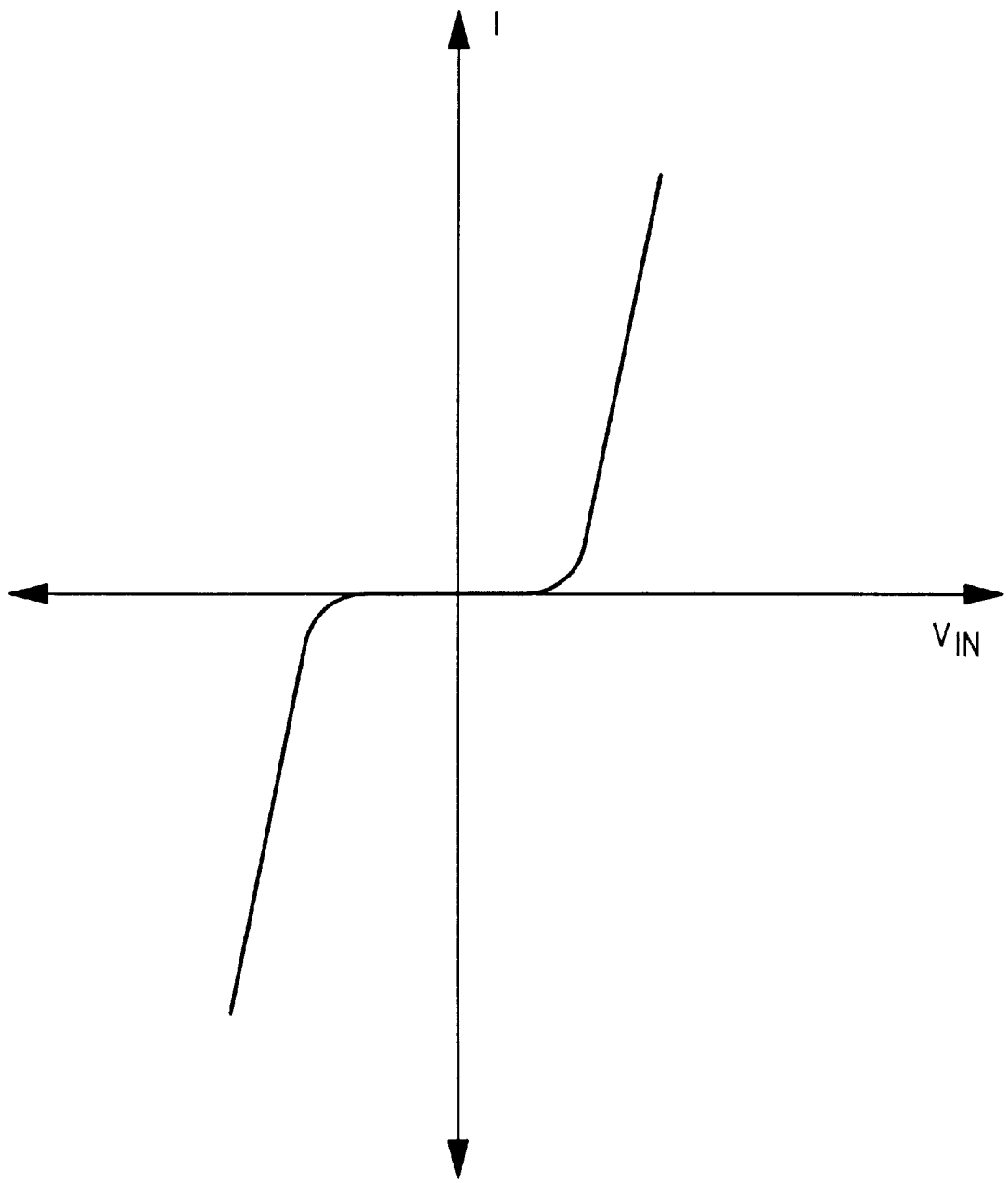
FIG. 3 is the transfer characteristic of input voltage versus current conduction of the P-channel device.

Referring now to FIGS. 2 and 3, once on, the P-channel device 30 will conduct current, which in turn will clamp the input node 10 from increased positive voltage as indicated by $V_{C1}$. If the diode 40 were not present the gate potential would not be limited to $V_{BE}$. Instead the gate potential would be $V_{G'}$ as shown in FIG. 2. Thus, without the diode 40, $V_{IN}$ would have to ramp up to a higher potential to establish the gate-source differential needed to reach a threshold voltage to turn on the P-channel device 30, as indicated by $V_{G'S}$. This would result in the circuit 100 clamping at a higher voltage as indicated by $V_{C2}$ in FIG. 2. However, note that the threshold voltage for the P-channel device 30 with the diode 40 present, i.e. $V_{GS}$, is equal to the threshold voltage without the diode, i.e. $V_{G'S}$.

For the case of excessive negative voltage excursion, as the voltage $V_{IN}$ at the input node 10 goes negative the gate voltage $V_G$ of the P-channel device 30 couples to the input node 10 through the capacitor 50 and pulls the gate voltage of the P-channel device 30 negative. Referring to FIG. 2, in the negative direction, $V_G$ is again shown slightly lagging $V_{IN}$ due to the dominance of the capacitor 50 in relation to the parasitic capacitance of the P-channel device 30. However, in this case, note that $V_{GS}$ is created between the gate of the P-channel device 30 and $V_{SS}$ 20. Referring to FIG. 3, when $V_{GS}$ reaches the threshold voltage of the P-channel device 30 it will turn on. Once on, current flows from $V_{SS}$ to the input node 10, thereby clamping the negative voltage at the input node 10 at $V_{C3}$.

In the final case, for non-excessive positive and negative voltage excursions, $V_{GS}$ does not reach the threshold voltage of the P-channel device 30 and therefore it will not turn on. With the P-channel device in the off state, there is no current flow, and $V_{IN}$ is passed unclamped with respect to the remainder of the circuit. With non-excessive voltage excursions $V_{IN}$ is unclamped which fulfills the high impedance requirement that the input node 10 not take power from the rest of the circuit.

The presence of the diode 40 also plays a critical part in achieving symmetrical clamping when the capacitor 50 is significantly larger than the parasitic capacitance. The diode 40 serves to establish a reference point at $V_{BE}$, rather than at $V_{G'}$, from which to apply $V_{GS}$ in the case of the positive excursion. The result is that the positive threshold $V_{GS}$ is reached at virtually the same absolute value $V_{IN}$ as is the negative threshold $V_{GS}$. Thus, the positive clamping voltage with the diode $V_{C1}$ is approximately of the same magnitude with opposite sign as the negative clamping voltage $V_{C3}$.

The present invention of symmetrical clamping over positive and negative input voltages is effective over a wide variety of the RF spectrum. A conventional definition of the RF spectrum is from 10 KHz, at the low end of the VLF (Very Low Frequency) band to 100 GHz, at the high end of the EHF (Extremely High Frequency band). The present invention has application approximately from 50 KHz on the low end to approximately 100 MHz on the high end. Preferred embodiments require operation at 62.5 KHz, 125 KHz, and within a band of 10–15 MHz, preferably 13 MHz.

Although the invention has been particularly shown and described with reference to a preferred embodiment thereof, it will be understood by those skilled in the art that changes in form and detail may be made therein without departing from the spirit and scope of the invention.

What is claimed is:

1. A positive and negative voltage clamp for an RF input circuit, comprising:
   an input node;
   a MOS transistor coupled to the input node, wherein the MOS transistor has a parasitic capacitance;
   a ground potential node coupled to the MOS transistor;
   a diode coupled to a control electrode of the MOS transistor and further coupled to the ground potential node; and
   a capacitor coupled to the input node and further coupled to the control electrode of the MOS transistor, wherein the capacitor has a capacitance that is larger than the parasitic capacitance of the MOS transistor, whereby the input node will be clamped to remain within substantially symmetrical positive and negative voltage values.

2. The clamp in accordance with claim 1 wherein the MOS transistor is a P-channel transistor.

3. The clamp in accordance with claim 1 wherein the MOS transistor is a N-channel transistor.

4. The clamp in accordance with claim 1 wherein the clamp is implemented on a single, monolithic integrated circuit.

5. The clamp in accordance with claim 1 wherein the capacitor has a range of 0.1 picofarad to 10 picofarads.

6. The clamp in accordance with claim 1 wherein the clamp operates over a frequency range of 50 kHz to 100 MHz.

7. The clamp in accordance with claim 1 wherein the clamp operates at approximately 62.5 KHz.

8. The clamp in accordance with claim 1 wherein the clamp operates at approximately 125 KHz.

9. The clamp in accordance with claim 1 wherein the clamp operates over a frequency range of 10 MHz to 15 MHz.

10. The clamp in accordance with claim 1 wherein the clamp operates at approximately 13 MHz.

11. The clamp in accordance with claim 1 wherein the clamp functions to provide a clamping voltage in response to an excessive positive input voltage.

12. The clamp in accordance with claim 11 wherein the input voltage is coupled to the control electrode of the MOS transistor by the capacitor.

13. The clamp in accordance with claim 12 wherein the input voltage is greater than a voltage at the control electrode of the MOS transistor.

14. The clamp in accordance with claim 13 wherein the voltage at the control electrode of the MOS transistor is approximately equal to a threshold voltage of the diode.

15. The clamp in accordance with claim 14 wherein the difference between the input voltage and the voltage at the control electrode is greater than the threshold voltage of the MOS transistor.

16. The clamp in accordance with claim 11 wherein the clamp functions to provide a second clamping voltage in response to an excessive negative input voltage.

17. The clamp in accordance with claim 16 wherein the input voltage is coupled to the control electrode of the MOS transistor by the capacitor.

18. The clamp in accordance with claim 17 wherein the input voltage is less than the voltage at the control electrode of the MOS transistor.

19. The clamp in accordance with claim 18 wherein the voltage at the control electrode of the MOS transistor is less than ground potential.

20. The clamp in accordance with claim 19 wherein the difference between the ground potential and the voltage at the control electrode is greater than the threshold voltage of the MOS transistor.

21. The clamp in accordance with claim 16 wherein the first clamping voltage in response to the excessive positive input voltage is symmetrical with respect to the second clamping voltage in response to the excessive negative voltage.

22. The clamp in accordance with claim 16 wherein an absolute value of the first clamping voltage is approximately equal to an absolute value of the second clamping voltage.

23. The clamp in accordance with claim 1 wherein the clamp functions without providing a clamping voltage in response to non-excessive positive input voltages.

24. The clamp in accordance with claim 1 wherein the clamp functions without providing a clamping voltage in response to non-excessive negative input voltages.

* * * * *